(12) United States Patent
Mihara

(10) Patent No.: US 6,643,207 B2
(45) Date of Patent: Nov. 4, 2003

(54) HIGH-VOLTAGE DETECTION CIRCUIT FOR A SEMICONDUCTOR MEMORY

(75) Inventor: Masaaki Mihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/176,633

(22) Filed: Jun. 24, 2002

(65) Prior Publication Data

US 2003/0133349 A1 Jul. 17, 2003

(30) Foreign Application Priority Data

Jan. 15, 2002 (JP) ........................................ 2002-006282

(51) Int. Cl.⁷ .............................................. G11C 7/00
(52) U.S. Cl. .............. 365/226; 365/189.07; 365/189.09
(58) Field of Search ............................. 365/226, 189.07, 365/189.09, 210, 189.11; 327/535

(56) References Cited

U.S. PATENT DOCUMENTS 5,808,954 A * 9/1998 Ichikawa ..................... 365/226

FOREIGN PATENT DOCUMENTS

| JP | 6-132739 | 5/1994 |
| JP | 2000-19200 | 1/2000 |

OTHER PUBLICATIONS

Tokumichi Tamai et al., "Semiconductor Circuit Designing Techinics", Nikkei BP Corporation, Apr. 4, 1987.

* cited by examiner

*Primary Examiner*—David Lam
(74) *Attorney, Agent, or Firm*—McDermott, Will & Emery

(57) ABSTRACT

In a high-voltage detection circuit (10) for detecting a high voltage (VP) output from a high-voltage generation circuit (14), an output of the high-voltage generation circuit is dropped in voltage by a high-voltage drop circuit (13) to output a dropped voltage (VO), a reference-voltage generation circuit (11) generates a reference voltage (Vref) of a comparatively-high potential using the the high voltage (VP) as its power source, and a comparison circuit (12) compares the dropped voltage (VO) with the reference voltage (Vref) to control a high-voltage level.

10 Claims, 7 Drawing Sheets

HIGH-VOLTAGE DETECTION CIRCUIT FOR A SEMICONDUCTOR MEMORY

BACKGROUND OF THE INVENTION

1. Field of the Invention

The present invention relates to a high-voltage detection circuit of a semiconductor integrated circuit, and particularly to a high-voltage detection circuit for setting a high voltage at a high-accuracy level used for a flash memory.

2. Description of the Prior Art

Generally, in a nonvolatile flash memory of a semiconductor integrated circuit, a high voltage level is necessarily used for extraction and injection of electric charges, and the high voltage level must be accurately set in order to accurately control electric charges when extracting or injecting electric charges from or into a floating gate of a memory cell.

In a conventional flash memory and the like device, a two-power-source configuration is used for obtaining, for example, a high voltage Vp of 12V from the outside of a chip and an internally-generated high voltage Vcc of 5V as the two power-source voltages. In recent years, however, such a two-power-source configuration is changed to a single power-source configuration as a technical trend as the power-source voltage Vcc is reduced, and the single power-source configuration is now mainly used for obtaining Vcc of 5V or 3V as an internally-generated high voltage.

According to this technical trend, for example, a charge-pump-type high-voltage generation circuit is used as a high-voltage power source. For example, when 3 V is used as a high voltage Vcc and a threshold voltage Vth is 0.6 V, a strive zone ranging between 0.6 and 2.6 V is used as an easily-controllable range.

This high voltage Vcc is generated by a high-voltage generation circuit such as a charge pump circuit in a device. However, since a voltage generated by a high-voltage generation circuit is fluctuated due to an operation condition of the circuit such as a power-source voltage level or temperature, the operation of a high-voltage generation circuit is controlled using a high-voltage detection circuit for detecting a high voltage.

FIG. 7 is a circuit diagram showing a configuration of a conventional high-voltage detection circuit and the configuration and operations of the circuit are disclosed in Japanese Patent Laid-Open No. 19200/2000 as a prior art thereof.

As shown in FIG. 7, a high-voltage detection circuit is provided with a resistor element 701 having a resistance value of R5 and a resister element 702 having a resistance value of R6 connected in series between an output terminal 700 of a high-voltage generation circuit and a ground potential GND line, a comparison circuit 703 and an inverter 708. The comparison circuit 703 includes P-channel MOS transistors 704 and 705 and N-channel MOS transistors 706 and 707.

The resistor elements 701 and 702 constitute a partial-voltage circuit or potential divider, and when assuming the potential of the output terminal 700 of the high-voltage generation circuit is set as VP and resistance values of the resistor elements 701 and 702 are set as R5 and R6 respectively, the partial-voltage potential VO of a node N1 between the resistor elements 701 and 702 becomes VO=VP·R6/(R5+R6).

The MOS transistors 704 and 706 and the MOS transistors 705 and 707 are respectively connected in series between the line of the power-source potential Vcc and the line of the ground potential GND. Gates of the MOS transistors 704 and 705 are both connected to the drain of the MOS transistor 704 and thus the MOS transistors 704 and 705 constitute a current mirror circuit. The partial-voltage potential VO on the node N1 is applied to the gate of the MOS transistors 706 and a reference potential Vref is applied to the gate of the MOS transistors 707. The drain of the MOS transistor 705 serves as an output node 703a of the comparison circuit 703 and an output signal of the comparison circuit 703 is inverted by the inverter 708 and the resultant output is generated as a high-voltage detection signal /DE.

When the potential VP is lower than a target potential and the potential VO is lower than the reference potential Vref, the conduction resistance value of the MOS transistor 706 becomes larger than that of the MOS transistor 707, a node 703a becomes L-level, and the high-voltage detection signal /DE becomes H-level. When VP exceeds the target potential and VO becomes higher than Vref, the resistance value of the MOS transistor 706 becomes smaller than that of the MOS transistor 707, the node 703a becomes H-level, and the signal /DE becomes L-level. The high-voltage generation circuit is activated when the signal /DE becomes H-level, and the high-voltage generation circuit is deactivated when the signal /DE becomes L-level. Thus, the potential of the output terminal 700 is kept at the target potential.

In the above conventional high-voltage detection circuit, the voltage conversion efficiency ΔVO/ΔVP becomes ΔVO/ΔVP=R6/(R5+R6). Since R6/(R5+R6)<1, the voltage conversion efficiency is lowered. Lowering of the voltage conversion efficiency deteriorates the detection accuracy of the high-voltage detection circuit, and moreover lowers the setting accuracy of a voltage level of high-voltage.

For example, when assuming VP as 9V and the reference potential Vref as 1.5 V, the voltage conversion efficiency becomes 1.5/9=R6/(R5+R6)=1/6. This indicates that the detected VP is fluctuated greatly by 0.1×6=0.6 V when Vref is fluctuated by 0.1 V due to dispersion and the like.

Thus, in the conventional example, a comparatively low potential such as Vref=1.5 V is used as the reference voltage Vref. However, the present invention is made by considering that a voltage conversion efficiency becomes 4.5/9=R6/(R5+R6)=1/2 by making it possible to set Vref to, for example, 4.5 V, so that the detected VP becomes 0.1×2=0.2 V to a Vref dispersion of 0.1 V, and the fluctuation can be decreased to 1/3 compared to the conventional example.

SUMMARY OF THE INVENTION

The present invention is made to solve the above problems and its object is to provide a high-voltage detection circuit capable of improving a voltage detection accuracy and realizing a stable voltage-detection accuracy by setting a reference voltage Vref to a comparatively high potential.

To achieve the above mentioned object, the present invention realizes a high-voltage detection circuit to have a high voltage-detection accuracy by constituting the high-voltage detection circuit so as to use a high voltage level output from a high-voltage generation circuit for the power source of a reference-voltage generation circuit in order to set the reference voltage Vref to a comparatively high voltage level.

According to the present invention, a high-voltage detection circuit detects a high voltage output from a high-voltage generation circuit in a semiconductor memory. The high-voltage detection circuit includes: a high-voltage drop circuit which drops the high voltage output of the high-voltage generation circuit and generates a dropped voltage; and a reference voltage generation circuit which receives the high voltage output of the high-voltage generation circuit to be used as an input voltage source and generates a reference voltage. The high-voltage detection circuit further includes a comparison circuit which compares the dropped voltage output of the high-voltage drop circuit with the reference voltage output of the reference-voltage generation circuit and thereby controls a high-voltage level of the high-voltage generation circuit.

With the above mentioned configuration, it is possible to provide a high-voltage detection circuit capable of setting a reference voltage obtained from a reference-voltage generation circuit to a potential higher than that of a conventional circuit, improving a voltage detection accuracy by using a high potential voltage output of the high-voltage generation circuit for the power source of the reference-voltage generation circuit, and realizing a stable voltage-detection accuracy.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DETAILED DESCRIPTION OF THE PREFERRED EMBODIMENTS

Figure 1:
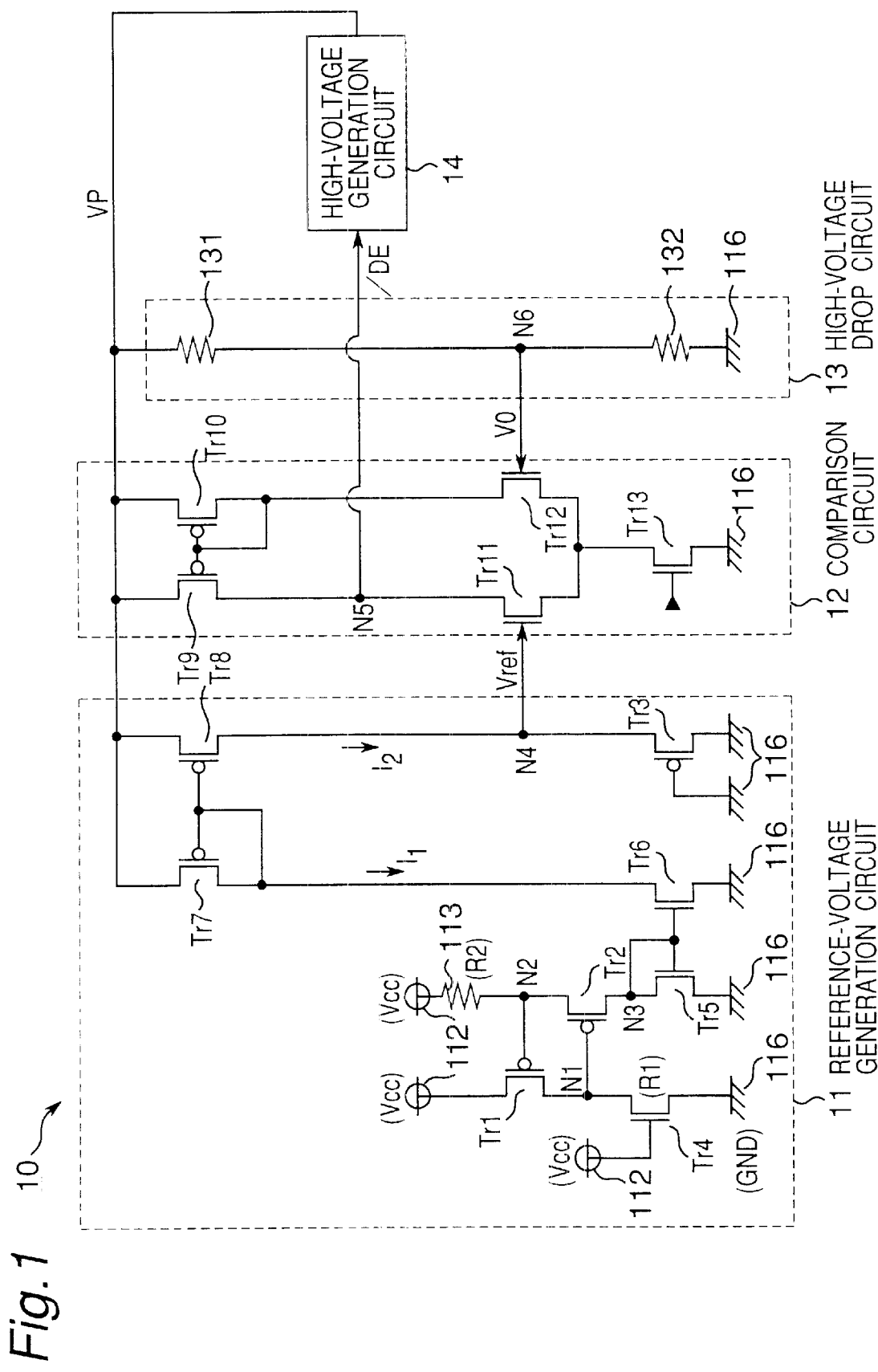
FIG. 1 is a circuit block diagram of a high-voltage detection circuit according to a first embodiment of the present invention.

Preferred embodiments of the present invention will be described below by ref erring to FIGS. 1 to 6. In the drawings, it is to be noted that, since the basic structures of the preferred embodiments are in common, like parts are designated by the same reference numerals or symbols throughout the accompanying drawings and their repetitive description is omitted.

[First Embodiment]

FIG. 1 is a circuit block diagram showing a configuration of a high-voltage detection circuit according to the first embodiment of the present invention. The configuration of the embodiment 1 is described below by referring to FIG. 1. As shown in FIG. 1, a high-voltage detection circuit 10, which is provided in an IC to detect a high power-source voltage, includes a reference-voltage generation circuit 11, a comparison circuit 12, and a high-voltage drop circuit 13 and the high-voltage detection circuit 10 controls a high voltage VP generated by a high-voltage generation circuit 14.

In the reference-voltage generation circuit 11, MOS transistors Tr1 and Tr4 are connected each other in series through a node N1 between the power-source line 112 of a potential Vcc and the ground line 116 of the ground potential GND. The source of the MOS transistor Tr1 is connected to a power-source line 112, the drain thereof is connected to the node N1, and the gate thereof is connected to a node N2 of an adjacent line. The drain of the MOS transistor Tr4 having a resistance R1 is connected to the node N1, the source thereof is connected to the ground line 116, and the gate thereof is connected to another power-source line 112 of a potential Vcc.

In the adjacent line including the node N2, a resistor 113 having a resistance R2 and MOS transistors Tr2 and Tr5 are connected in series between another power-source line 112 of a potential Vcc and a ground line 116 of GND through the node N2. These three power-source lines 112 of Vcc can be common. The gate of the MOS transistor Tr2 is connected to the node N1, the source thereof is connected to the node N2, and the drain thereof is connected in common to the drain and gate of the MOS transistor Tr5 through a node N3.

A pair of MOS transistors Tr5 and Tr6 constitute a current mirror circuit, the gate and drain of the MOS transistor Tr5 are connected to the node N3, and the source of the MOS transistor Tr5 is connected to the ground line 116. The gate of the MOS transistor Tr6 is connected in common to the node N3 and the gate of the MOS transistor Tr5, the source of the MOS transistor Tr6 is connected to the ground line 116, and the drain thereof is connected to a high-voltage output terminal side through a MOS transistor Tr7.

In this configuration, there flows a reference current $I_1$ from the MOS transistor Tr7 to the MOS transistor Tr6, which the reference current is decided in accordance with a ratio between a gate width and gate length of the MOS transistor Tr6 and a ratio between a gate length and gate width of the MOS transistor Tr5.

A pair of MOS transistors Tr7 and Tr8 constitute a current mirror circuit and a MOS transistor Tr3 serves as a resistor element. Thus, there flows a current $I_2$ from the MOS transistor Tr8 to the MOS transistor Tr3 through an output node N4 to thereby generate a constant reference voltage Vref from the output node N4.

That is, the resistance value of the MOS transistor Tr3 can be trimmed and the ratio W/L between the gate width and the gate length of the transistor Tr3 is made small enough. Thereby, the reference voltage Vref is provided as the ratio between the constant reference current $I_2$ supplied from the MOS transistor Tr8 and the resistance value of the MOS transistor Tr3 and is output from the node N4.

In the above configuration, the present embodiment has a specific feature that the sources of the MOS transistors Tr7 and Tr8 are connected to the high voltage (VP) output terminal of the high-voltage generation circuit 14. Thereby, it is possible to set the reference voltage Vref to a high voltage level such as 4.5 V and improve a voltage detection accuracy.

In the comparison circuit 12, MOS transistors Tr9 and Tr11 serially connected through a node N5 and MOS transistors Tr10 and Tr12 serially connected are respectively connected to a MOS transistor Tr13 functioning as a resistor element. These MOS transistors Tr9, Tr10, Tr11, Tr12 and Tr13 are provided between the high-voltage potential (VP) output line and the ground line 116 of potential GND.

That is, the sources of the P-channel MOS transistors Tr9 and Tr10 are connected to the high-voltage potential (VP) line and the gates thereof are connected in common to the drain of the P-channel MOS transistor Tr10, and the transistors Tr9 and Tr10 pair constitute a current mirror circuit. The sources of the MOS transistors Tr11 and Tr12 are connected to the ground line 116 through the MOS transistor Tr13.

The reference potential Vref is applied to the gate of the N-channel MOS transistor Tr11 from the output node N4 of the reference-voltage generation circuit 11. Meanwhile, a dropped-voltage potential VO is applied to the gate of the N-channel MOS transistor Tr12 from the high-voltage drop circuit 13 to be described later. The node N5 connected to the drain of the MOS transistor Tr9 serves as an output node of the comparison circuit 12 so that an output signal /DE of the comparison circuit 12 is applied to the high-voltage generation circuit 14 from the node N5.

In this configuration, the high-voltage potential VP generated by the high-voltage generation circuit 14 is used as a power source voltage of the comparison circuit 12, and it is possible to easily raise the reference potential Vref to a comparatively high voltage level.

The high-voltage drop circuit 13 includes resistor elements 131 and 132, which are connected in series through a node N6 between the high-voltage potential (VP) line and the ground line 116 of potential GND to constitute a partial-voltage (potential divider) circuit of a resistance-division type. When assuming resistance values of the resistor elements 131 and 132 as R5 and R6 respectively, the dropped potential VO of the node N6 between the both resistor elements is shown as below:

$$VO=VP \cdot R6/(R5+R6)$$

When the high-voltage potential VP is lower than a target potential and the potential VO of the node N6 is lower than the reference potential Vref, a conducting resistance value of the MOS transistor Tr12 becomes larger than a conducting resistance value of the MOS transistor Tr11, the node N5 becomes L-level, and a high-voltage detection signal /DE becomes H-level.

On the contrary, when the high-voltage potential VP exceeds the target potential and the potential VO becomes higher than the reference potential Vref, the resistance value of the MOS transistor Tr12 becomes smaller than the resistance value of the MOS transistor Tr11, and the node N5 becomes H-level, and the signal /DE becomes L-level. The high-voltage generation circuit 14 is activated when the high-voltage detection signal /DE becomes H-level but the high-voltage generation circuit 14 is inactivated when the signal /DE becomes L-level. Thus, the high-voltage output potential VP is kept at the target potential.

[Second Embodiment]

Figure 2:
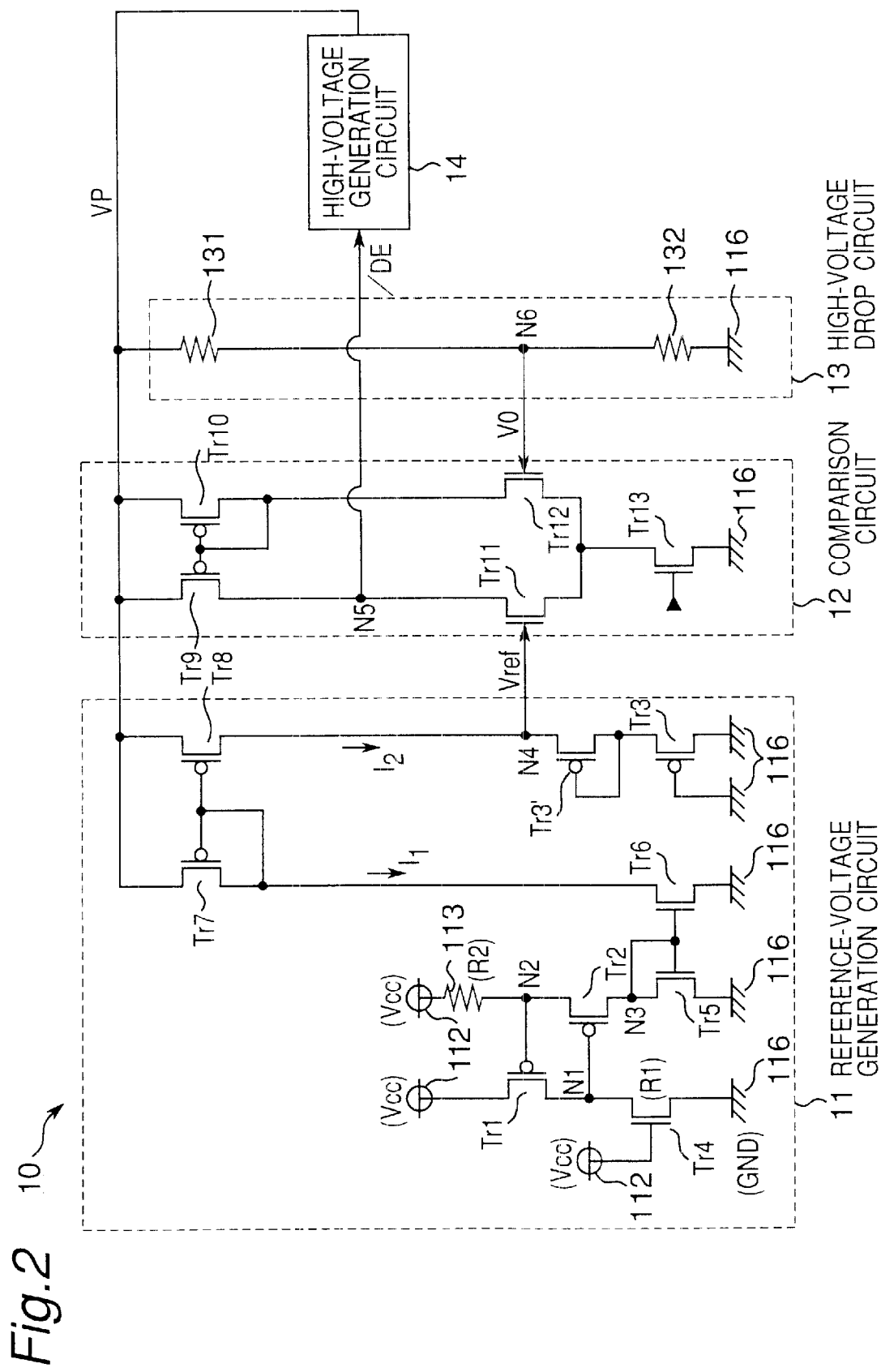
FIG. 2 is a circuit block diagram of a high-voltage detection circuit according to a second embodiment of the present invention.

FIG. 2 shows a circuit configuration of a second embodiment of a high-voltage detection circuit according to the present invention. The second embodiment of the present invention is described below by referring to FIG. 2. The basic configuration of the second embodiment is similar to that of the above first embodiment but the second embodiment is different from the first embodiment in that, in the second embodiment, there is additionally mounted a MOS transistor Tr3' which is diode-connected to the MOS transistor Tr3 in series, functioning as a resistor element provided in the reference-voltage generation circuit 11.

This is because the current $I_2$ to be supplied to the transistor Tr3 must be increased when the current/voltage conversion is performed using only the transistor Tr3 as in the case of the first embodiment, which increases a load of the high-voltage generation circuit 14.

Therefore, the transistor Tr3' is additionally mounted in the second embodiment to perform current/voltage conversion using a plurality of transistors (Tr3 and Tr3' in the case of FIG. 2). Thus, it is possible to decrease the load of the high-voltage generation circuit and set the reference voltage Vref to a comparatively high potential.

[Third Embodiment]

Figure 3:
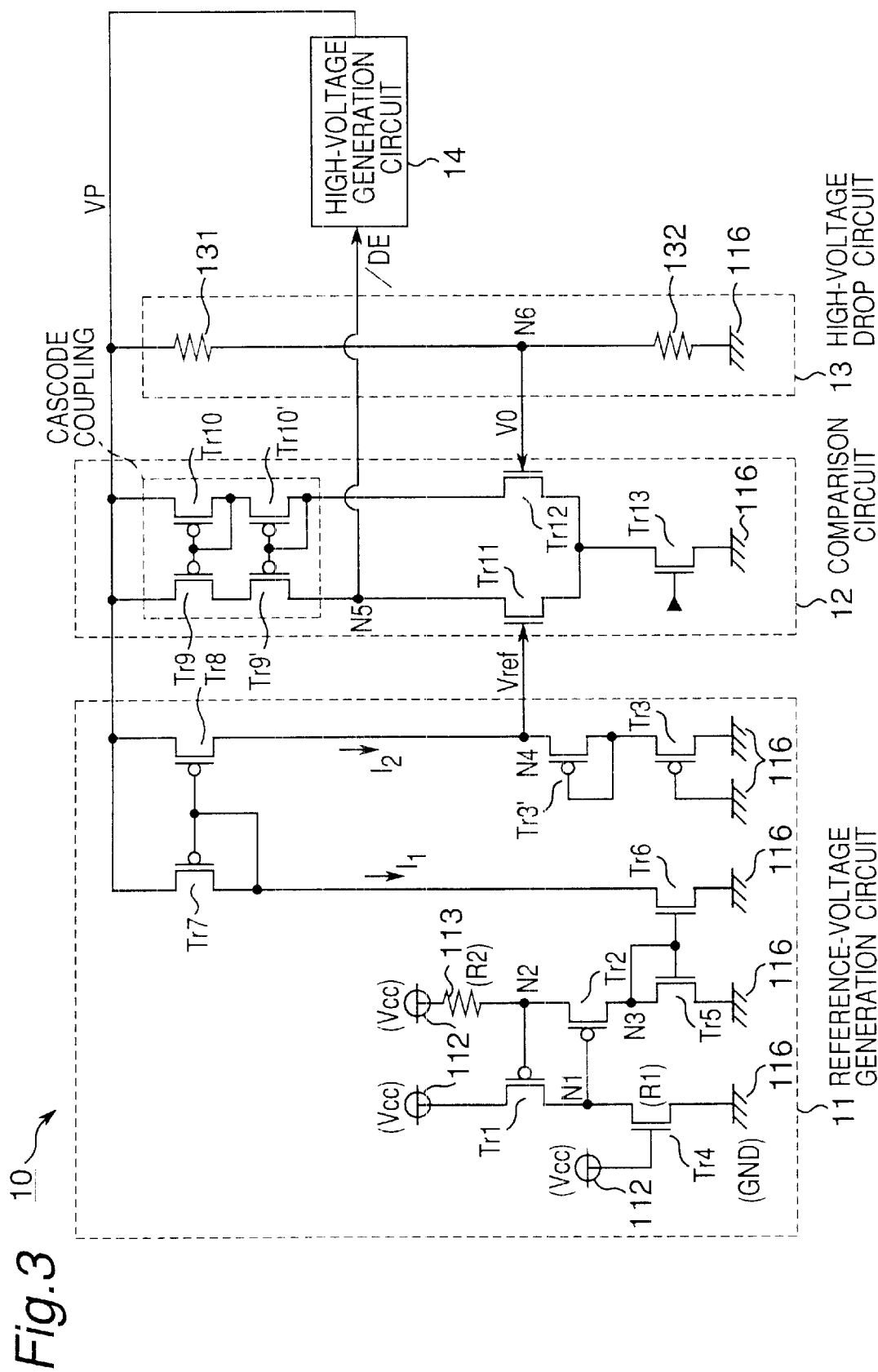
FIG. 3 is a circuit block diagram of a high-voltage detection circuit according to a third embodiment of the present invention.

FIG. 3 shows a circuit configuration of a third embodiment of a high-voltage detection circuit according to the present invention. The third embodiment of the present invention is described below by referring to FIG. 3. The third embodiment is similar to the above first and second embodiments in basic configuration but the third embodiment is different from the first and second embodiments in that a current mirror circuit is constituted with a cascode coupling in the third embodiment.

In specific, although a current mirror circuit is constituted by the transistors Tr9 and Tr10 in the comparison circuit 12 in the first and second embodiments, an additional current mirror circuit is formed in the third embodiment by adding transistors Tr9' and Tr10' in parallel with the current mirror circuit formed by the transistors Tr9 and Tr10. By using the above cascode coupling configuration, a mirror efficiency of the current mirror is improved and a more-stable comparison circuit can be constituted.

[Fourth Embodiment]

Figure 4:
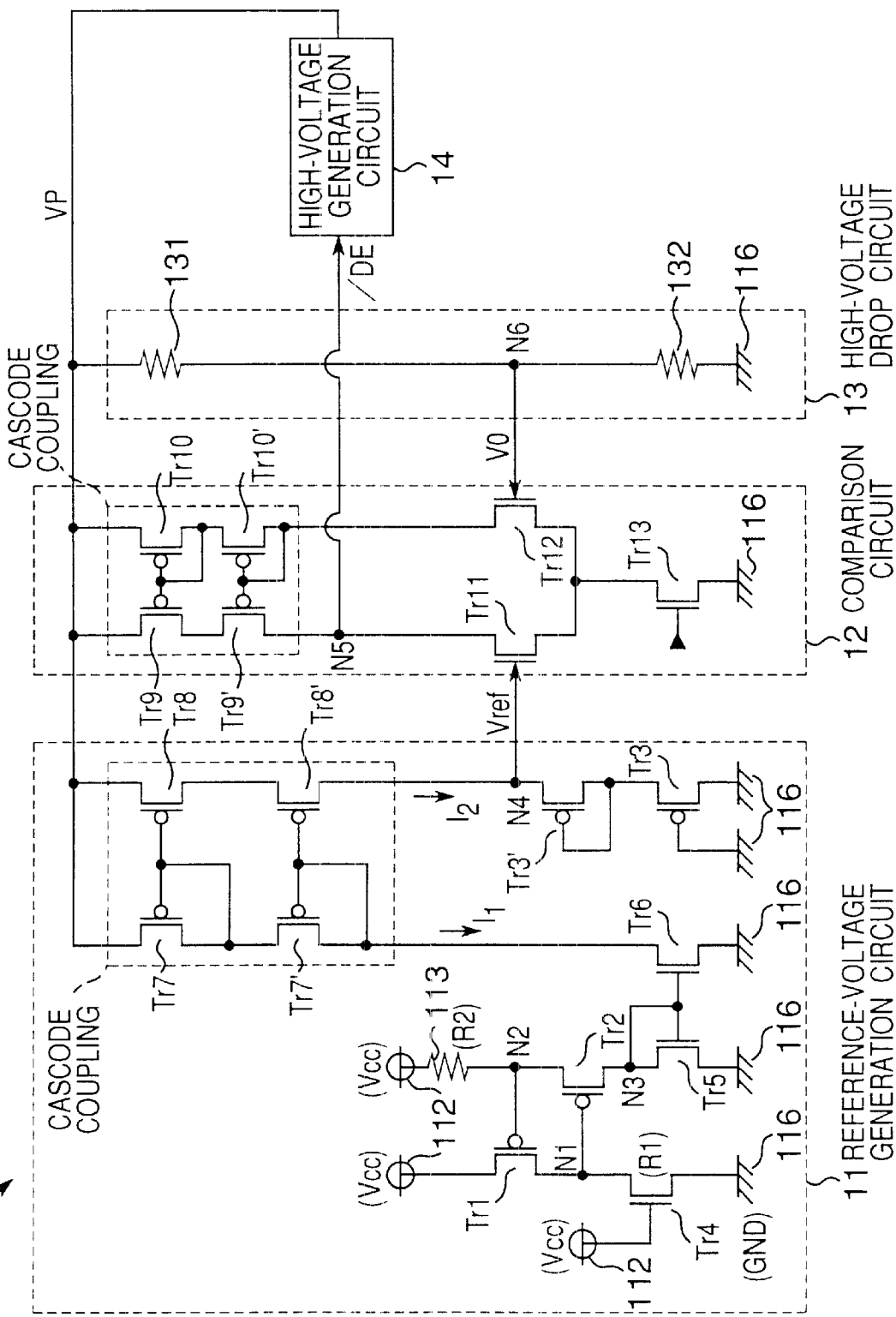
FIG. 4 is a circuit block diagram of a high-voltage detection circuit according to a fourth embodiment of the present invention.

FIG. 4 shows a circuit configuration of a fourth embodiment of a high-voltage detection circuit according to the present invention. The fourth embodiment of the present invention is described below by referring to FIG. 4.

The fourth embodiment is similar to the above third embodiment in basic configuration but the fourth embodiment is different from the third embodiment in that an additional current mirror circuit is formed by adding MOS transistors Tr7' and Tr8' in parallel to the current mirror circuit formed of the MOS transistors Tr7 and Tr8 provided in the reference-voltage generation circuit 11. Thus, the current mirror circuits are arranged in a configuration of cascode coupling in the fourth embodiment.

By using the configuration of the above cascode coupling, the mirror efficiency of the current mirrors is improved and a more-stable reference-voltage generation circuit can be constituted.

[Fifth Embodiment]

Figure 5:
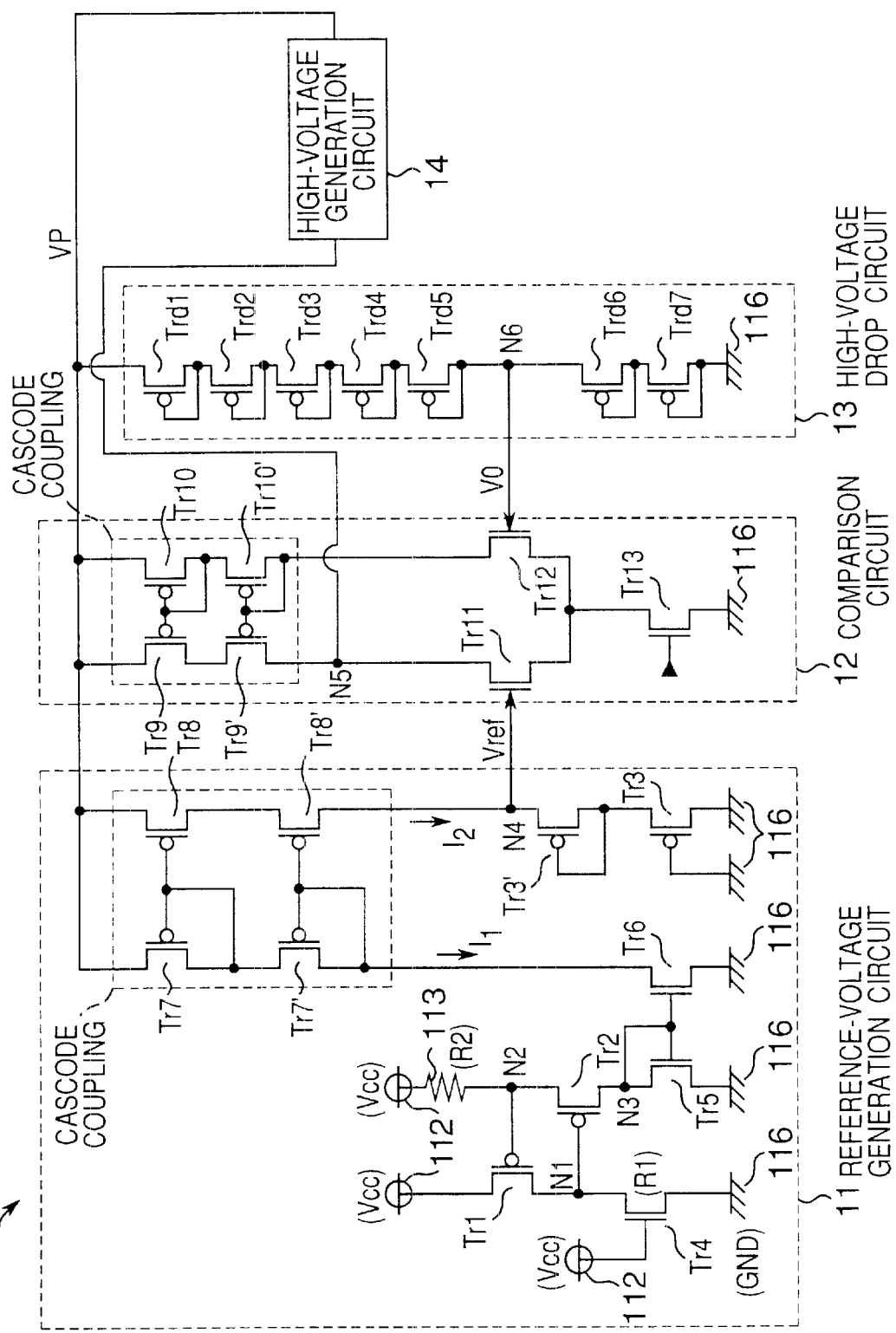
FIG. 5 is a circuit block diagram of a high-voltage detection circuit according to a fifth embodiment of the present invention.

FIG. 5 shows a circuit configuration of a fifth embodiment of a high-voltage detection circuit according to the present invention. The fifth embodiment of the present invention is described below by referring to FIG. 5. The fifth embodiment is similar to the above fourth embodiment in basic configuration but the fifth embodiment is different from the fourth embodiment in that, in the fifth embodiment, the high-voltage drop circuit 13 is constituted by a plurality of MOS transistors obtained by diode-connecting resistive elements of the transistors. Whereas, in the fourth embodiment, the high-voltage drop circuit 13 is provided with the resistor elements 131 and 132 connected in series to constitute a resistance-division typed partial-voltage circuit.

That is, a resistive element is generally formed by a diffusion layer of a transistor, and the diffusion layer requires a large layout area in order to obtain a preferable resistance value. Therefore, in this embodiment 5, there are provided a plurality of diode-connected MOS transistors Trd1 to Trd5 instead of the resistor element 131 and further provided diode-connected MOS transistors Trd6 and Trd7 instead of the resistor element 132.

According to the above configuration, since the same resistance value can be obtained in a smaller area compared to the case of a resistive element using a diffusion layer, it is possible to realize a voltage drop circuit in a smaller layout area.

Moreover, an advantage is obtained that a voltage rise is suppressed in accordance with a diode characteristic since more current flows when the voltage VP supplied from the high-voltage generation circuit 14 excessively rises.

It is noted here that, though FIG. 5 shows a configuration obtained by diode-connecting PMOS transistors, it is also possible to realize the configuration by NMOS transistors.

[Sixth Embodiment]

Figure 6:
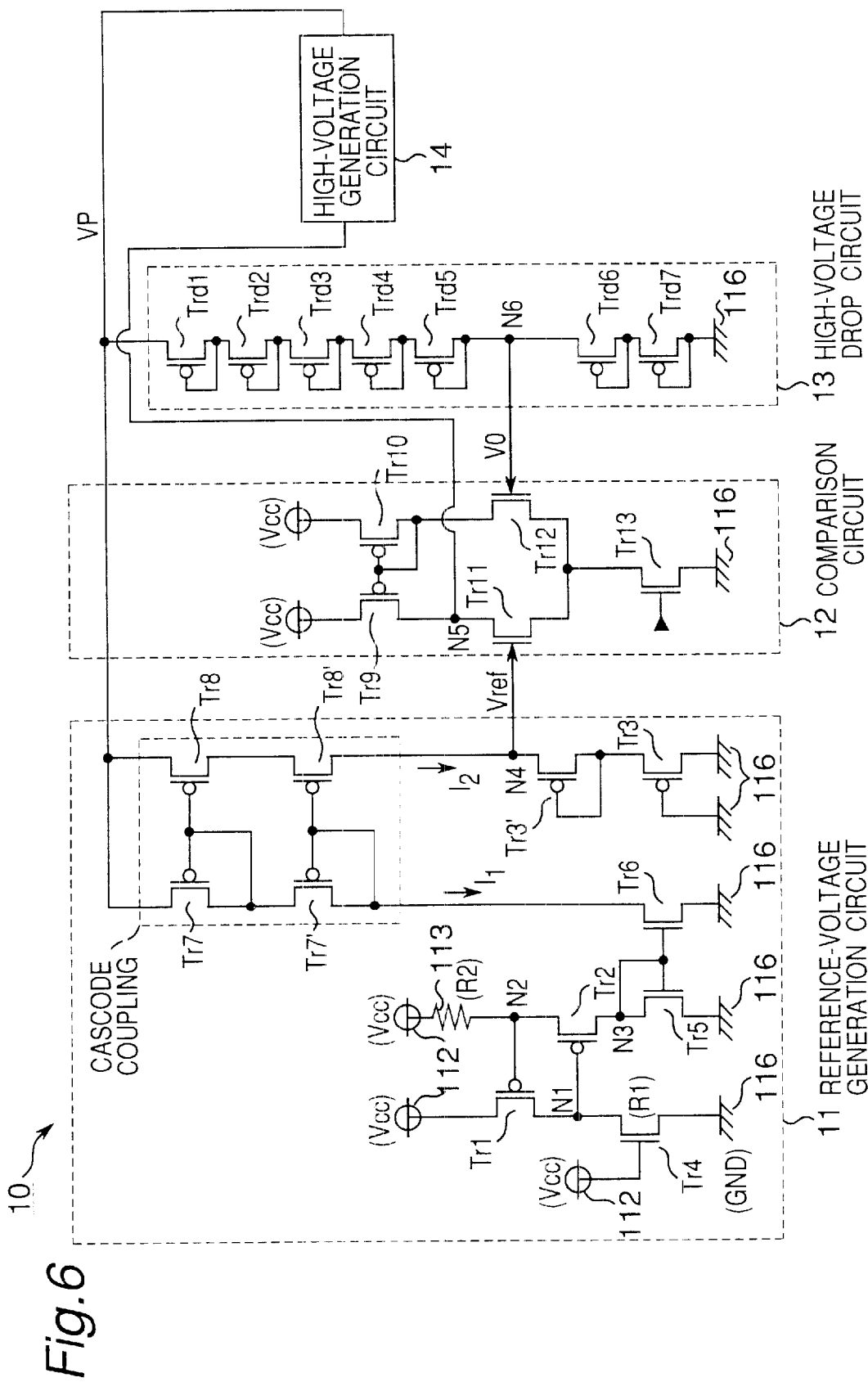
FIG. 6 is a circuit block diagram of a high-voltage detection circuit according to a sixth embodiment of the present invention.
Figure 7:
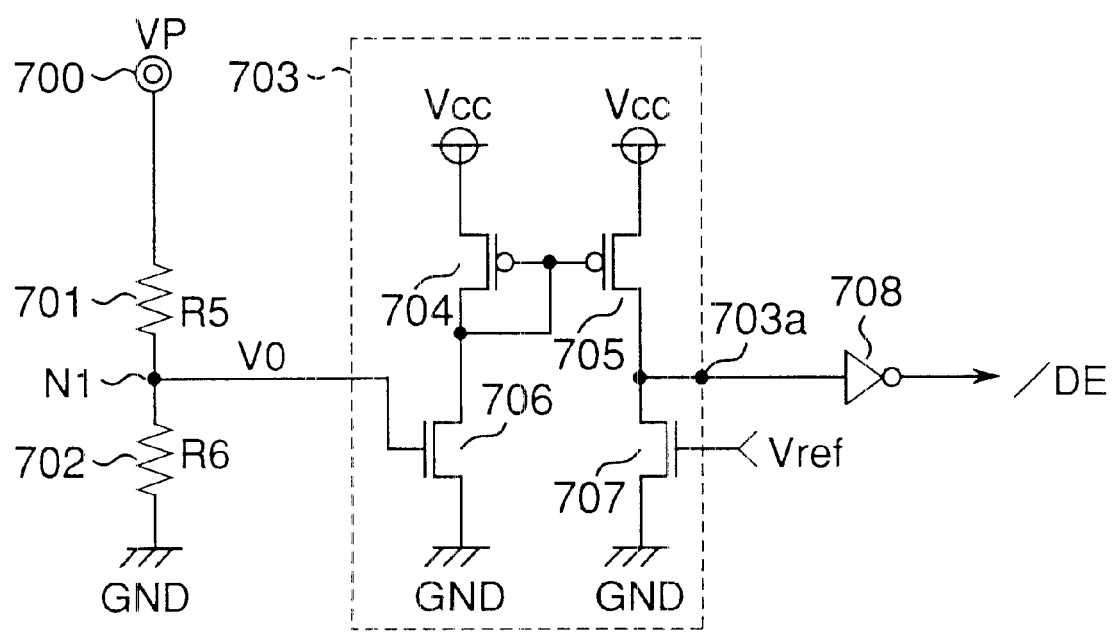
FIG. 7 is a circuit diagram of a conventional high-voltage detection circuit.

FIG. 6 shows a circuit configuration of a sixth embodiment of a high-voltage detection circuit according to the present invention. The sixth embodiment of the present invention is described below by referring to FIG. 6. The sixth embodiment is similar to the above fifth embodiment in basic configuration but the sixth embodiment is different from the fifth embodiment in that the sixth embodiment uses a power-source voltage Vcc as the power source of the comparison circuit 12. Whereas, in the first to fifth embodiments, the high-voltage VP output from the high-voltage generation circuit 14 is used as the power source of the comparison circuit 12.

By this configuration of the sixth embodiment, the same advantage as the case of the first to fifth embodiments can be obtained.

As described in connection with the preferred embodiments 1 to 6, according to a fist aspect of the present invention, a high-voltage detection circuit detects a high voltage output from a high-voltage generation circuit in a semiconductor memory. The high-voltage detection circuit includes: a high-voltage drop circuit which drops the high voltage output of the high-voltage generation circuit and generates a dropped voltage; and a reference voltage generation circuit which receives the high voltage output of the high-voltage generation circuit to be used as an input voltage source and generates a reference voltage. The high-voltage detection circuit further includes a comparison circuit which compares the dropped voltage output of the high-voltage drop circuit with the reference voltage output of the reference-voltage generation circuit and thereby controls a high-voltage level of the high-voltage generation circuit.

With the above mentioned configuration, it is possible to set the reference voltage Vref to a comparatively high voltage level and improve a voltage detection accuracy by using a high potential voltage output of the high-voltage generation circuit for the power source of the reference-voltage generation circuit.

According to another aspect of the present invention, the reference-voltage generation circuit includes: a first resistive element connected between a first power source and a first node; a first transistor element connected between the first node and a second power source; a second resistive element connected between the second power source and a second node; and a second transistor element connected between the second node and an output terminal.

In this configuration, a control terminal of the first transistor element is connected with the second node, a control terminal of the second transistor element is connected to the first node, a mirror-current is produced by a current mirror circuit based on a current obtained through the output terminal using the high voltage, and the mirror-current is current/voltage-converted by a third transistor element to thereby generate the reference voltage.

In this configuration, the third transistor element of the reference-voltage generation circuit may be comprised of a plurality of transistor elements. Thus, it is possible to decrease the load of the high-voltage generation circuit and the reference voltage Vref can be set to a comparatively high potential.

Moreover, the current mirror circuit of the reference-voltage generation circuit may have a cascode coupling configuration. Thus, by including the cascode coupling configuration, the mirror efficiency of a current mirror is improved and a more-stable reference-voltage generation circuit can be constituted.

According to further another aspect of the present invention, the comparison circuit may include a current mirror circuit and a power source voltage thereof is the high voltage output of the high-voltage generation circuit. Thus, by using a high-voltage potential from the high-voltage generation circuit for the power source of the comparison circuit, it is possible to easily raise the reference potential Vref to a high voltage.

According to further another aspect of the present invention, the comparison circuit may include a current mirror circuit having a cascode coupling configuration. By using the cascode coupling configuration, the mirror efficiency of a current mirror can be improved and a more-stable comparison circuit can be constituted.

According to further another aspect of the present invention, the high-voltage drop circuit may be a partial-voltage circuit of resistance division formed of a plurality of resistive elements connected in series.

Moreover, the high-voltage drop circuit may be a partial-voltage circuit formed of a plurality of diode-connected transistor elements connected in series.

By constituting a high-voltage drop circuit by a plurality of diode-connected transistor elements, it is possible to realize a voltage drop circuit of a less layout area. In addition, there may be obtained an advantage that a voltage rise is effectively suppressed by a diode characteristic since more current flows when a voltage from a high-voltage generation circuit excessively rises.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A high-voltage detection circuit which detects a high voltage output from a high-voltage generation circuit in a semiconductor memory, the high-voltage detection circuit comprising:

a high-voltage drop circuit which drops the high voltage output of the high-voltage generation circuit and generates a dropped voltage;

a reference voltage generation circuit which receives the high voltage output of the high-voltage generation circuit to be used as an input voltage source and generates a reference voltage; and a comparison circuit which compares the dropped voltage output of the high-voltage drop circuit with the reference voltage output of the reference-voltage generation circuit and thereby controls the high-voltage generation circuit to generate an adjusted high voltage.

2. The high-voltage detection circuit according to claim 1, wherein the reference-voltage generation circuit includes:
   a first resistive element connected between a first power source and a first node;
   a first transistor element connected between the first node and a second power source;
   a second resistive element connected between the second power source and a second node; and
   a second transistor element connected between the second node and an output terminal, and
   wherein a control terminal of the first transistor element is connected with the second node, a control terminal of the second transistor element is connected to the first node, a mirror-current is produced by a current mirror circuit based on a current obtained through the output terminal using the high voltage, and the mirror-current is current/voltage-converted by a third transistor element to thereby generate the reference voltage.

3. The high-voltage detection circuit according to claim 2, wherein the third transistor element of the reference-voltage generation circuit is comprised of a plurality of transistor elements.

4. The high-voltage detection circuit according to claim 2, wherein the current mirror circuit of the reference-voltage generation circuit has a cascode coupling configuration.

5. The high-voltage detection circuit according to claim 2, wherein the comparison circuit uses the second power-source voltage for its power source voltage.

6. The high-voltage detection circuit according to claim 1, wherein the comparison circuit includes a current mirror circuit and a power source voltage thereof is the high voltage output of the high-voltage generation circuit.

7. The high-voltage detection circuit according to claim 1, wherein the comparison circuit includes a current mirror circuit having a cascode coupling configuration.

8. The high-voltage detection circuit according to claim 1, wherein the high-voltage drop circuit is a partial-voltage circuit of resistance division formed of a plurality of resistive elements connected in series.

9. The high-voltage detection circuit according to claim 1, wherein the high-voltage drop circuit is a partial-voltage circuit formed of a plurality of diode-connected transistor elements connected in series.

10. The high-voltage detection circuit according to claim 1, wherein the high-voltage generation circuit is a charge pump circuit.

* * * * *